United States Patent [19]
Höll et al.

[11] 3,975,665
[45] Aug. 17, 1976

[54] WIRELESS SET HAVING CIRCUIT PLATE BARS ARRANGED IN A FRAME

[75] Inventors: Ludwig Höll, Sandweier; Adalbert Winkler, Baden-Baden; Eberhard L. Grünewald, Rastatt, all of Germany

[73] Assignee: Becker Flugfunkwerk, Baden-Baden-Oos, Germany

[22] Filed: Aug. 2, 1974

[21] Appl. No.: 494,146

[30] Foreign Application Priority Data
Aug. 18, 1973  Germany............................ 7330252

[52] U.S. Cl........................................... 317/101 DH
[51] Int. Cl.²........................................... H02B 1/02
[58] Field of Search......... 317/101 DH; 339/17 LG, 339/17 LM, 17 M, 150 B, 151 B, 176 MP

[56] References Cited
UNITED STATES PATENTS
2,566,425   9/1951   Paine et al. ..................... 317/101 C
2,925,537   2/1960   Winkler ......................... 339/17 LM
3,129,991   4/1964   Scmitz........................... 317/101 DH Primary Examiner—David Smith, Jr.
Attorney, Agent, or Firm—Allison C. Collard

[57] ABSTRACT

A wireless set such as a radio telephone, transmitter, aircraft wireless navigation or indication set having at least one circuit plate bar arranged in a frame so that the plate bar will contain circuit elements of a printed circuit. Along one edge of a circuit bar is contained a row of guide pins for connection with other housing parts. These pins are plugged into a corresponding row of adapter sockets in a cable plate or into a multi-polar socket so that the row of guide pins of each circuit plate or the row of sockets in the cable plate are arranged so that the plate bar may be pulled out of the frame in its operating position and plugged into a freely accessible testing position on the cable plate or the multi-pole socket.

2 Claims, 6 Drawing Figures

WIRELESS SET HAVING CIRCUIT PLATE BARS ARRANGED IN A FRAME

This invention relates to a wireless set and particularly, a transmitter, aircraft wireless set, or navigation and indication set, respectively, having circuit plate bars arranged in a frame.

Wireless sets, or navigation and indication sets are known in the art, wherein the circuit elements are printed onto a circuit plate bar or module. In the known devices, rows of guide pins are provided along one edge of the plate bar for connecting other housing parts therewith, and which then can be plugged into a corresponding row of adapter sockets or a multipolar socket which is provided, for example, in a cable or connection plate. However, the wireless sets of the above type are disadvantageous because due to the close spacing of the circuit plate bars which are in series with respect to each other to result in a rather compact device, a paramount requirement for mobile radio telephone sets, or aircraft wireless sets, it is rather difficult to test the individual plate bars during operation, and repairs are only possible under extreme difficulties. To test the plate bars, it is necessary to provide intermediary guide pins, with associated connector cables, so that these intermediary plugs are plugged into the corresponding rows of adapter sockets and connected with the plate bar.

It is therefore an object of subject invention to provide a wireless, navigation or indicator set of the aforementioned type, whereby the individual plate bars may be removed at any time from their normal operating position and be reinstalled without any additional auxiliary means. The individual plate bars are easily accessible so that their functions and their individual parts can be easily tested and, if required, easily repaired.

In accordance with the object of the invention, the wireless set has circuit plate bars wherein either one or a plurality contain printed circuit elements, and are provided with a row of conductive guide pins, so as to connect with other set parts which are plugged into a corresponding row of sockets of a cable plate, or into a multipolar socket. The row of guide pins of each circuit plate bar and/or the row of sockets in the cable plates or a multipolar socket are arranged so that the plate bar may be pulled out of the frame in its operating position and plugged into a freely accessible testing position on the cable plate or the multipolar socket.

In a further embodiment of the invention, the wireless set is provided with a row of guide pins, whereby each plate bar can be connected to a second row of adapter sockets which are connected to the first row of sockets. Thus, each plate bar may be removed from the frame and the first row of sockets, and may be plugged into the second row of sockets in an opposite direction. Thereby two coupled rows of sockets are spaced apart from each other in the cable plate, so that the plate bar with their extending row of guide pins along their parallel edges may be plugged into the row of sockets from either side.

This arrangement has the advantage that when the plate bar is tested, it may be simply pulled out of the frame and plugged into the second row of adapter sockets on the free side of the cable plate, so that the plate bar is connected with all connections, and is readily accessible from all sides. Such an arrangment is particularly advantageous in compact wireless sets and aircraft sets so they can be properly serviced.

In a further embodiment of the invention, the row of guide pins may be in a right angle or L-shaped position in the plate bar, so that one shank of the guide pins extends vertically through the plate bar in the range of the edge, so that the plate bar can be plugged into the multipolar socket when the set is in operation. The other shank runs parallel to the plate bar along the edge, so that the plate bar may be vertically plugged into the socket when the set is in test position. Thus, the plate bar, which is horizontally plugged into the usually flat aircraft set, can be removed and set up in a vertical test position. Two preferred embodiments are described in detail in the following specification and in conjunction with the appended drawings.

In the drawings wherein similar reference characters denote similar elements in the several views.

Figure 1:
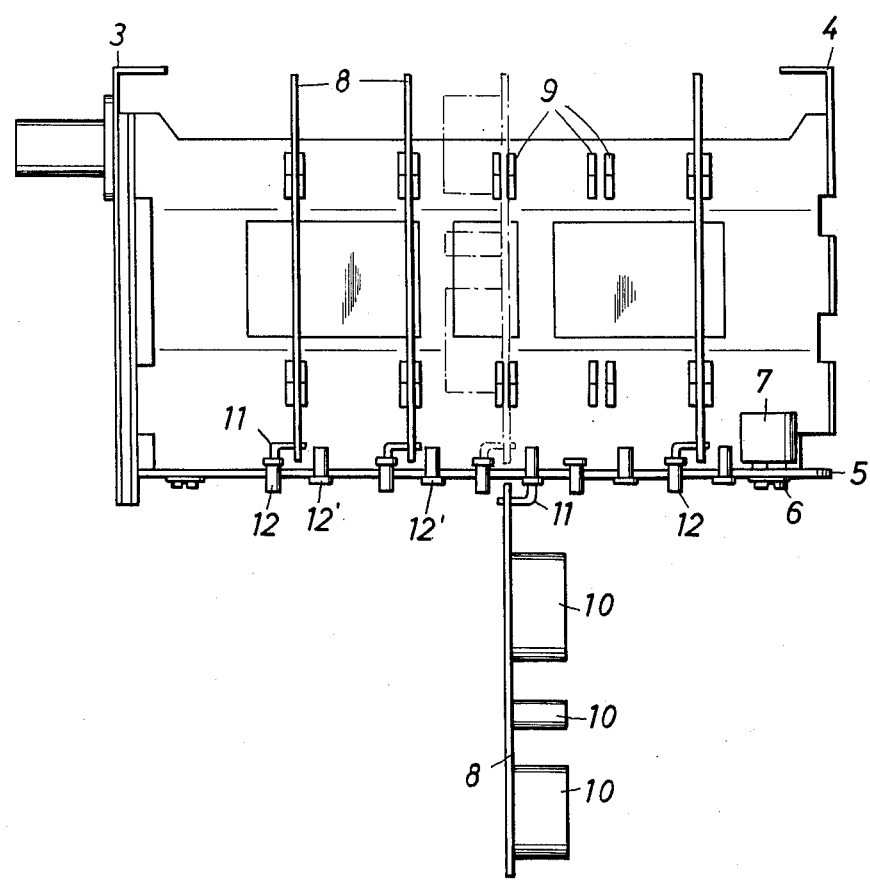
FIG. 1 is a sideview of a chassis of an aircraft wireless set with a plugged in plate bar.
Figure 2:
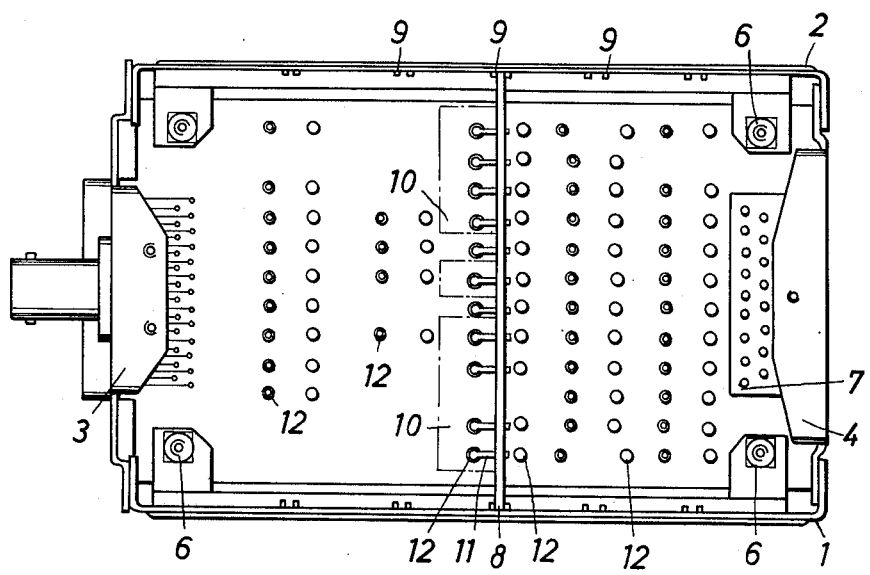
FIG. 2 is a view from beneath the set in accordance with the embodiment shown in FIG. 1.
Figure 3:
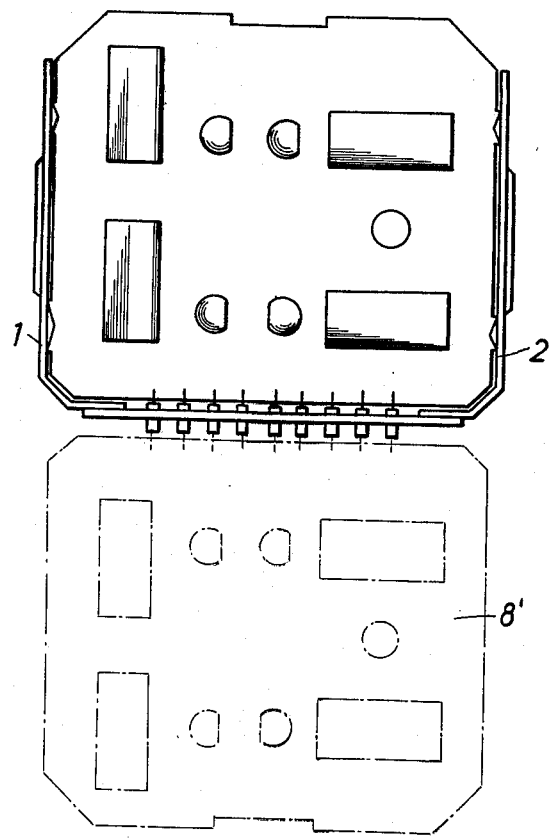
FIG. 3 is a front view of the chassis according to FIG. 1 with an oppositely plugged in plate bar indicated in dotted lines.

Referring to FIGS. 1-3, the inventive wireless set consists essentially of a frame 1 and 2, as well as a front wall 3 and a rear wall 4 forming a chassis. On the underside of the chassis, a cable plate 5 is mounted by means of retainer screws 6. At the rear side, cable plate 5 is provided with a socket connection 7. To operate the wireless set, a plurality of plate bars or modules 8 are inserted between side walls 1 and 2 of the frame, and plugged into cable plate 5. In this embodiment only three plate bars are shown. For this purpose guide grooves 9 are provided on the inside of side walls 1 and 2 to guide and hold the inserted plate bars.

As is generally known, plate bars 8 are made of pertinax or epoxy resin, and receive the individual circuit elements 10 such as resistors, capacitors, transistors, integrated circuits etc, in a printed circuit. Along one edge, plate bars 8 are provided with one row of a plurality of guide pins 11 which serve as the connection between the circuit elements 10 and cable plate 5. For this purpose, the row of guide pins 11 is plugged into a corresponding row of sockets 12 which are accessible to the guide pins 11 within the chassis, thereby providing the connection for the total circuit. Each socket or row of sockets 12 is connected with a second socket 12' in such a manner that a second row of sockets is spaced apart from the first row of sockets. In order to test a plate bar 8 or to repair one respectively, the plate bar is pulled out from frame 1 and 2, and the corresponding row of sockets 12, and as shown in FIG. 3 at 8', plugged in from below into the corresponding row of sockets 12'. Thus, all functions of plate bar 8' may be tested with suitable testing devices. The front side as well as the rear side of plate bar 8' are easily accessible.

Figure 4:
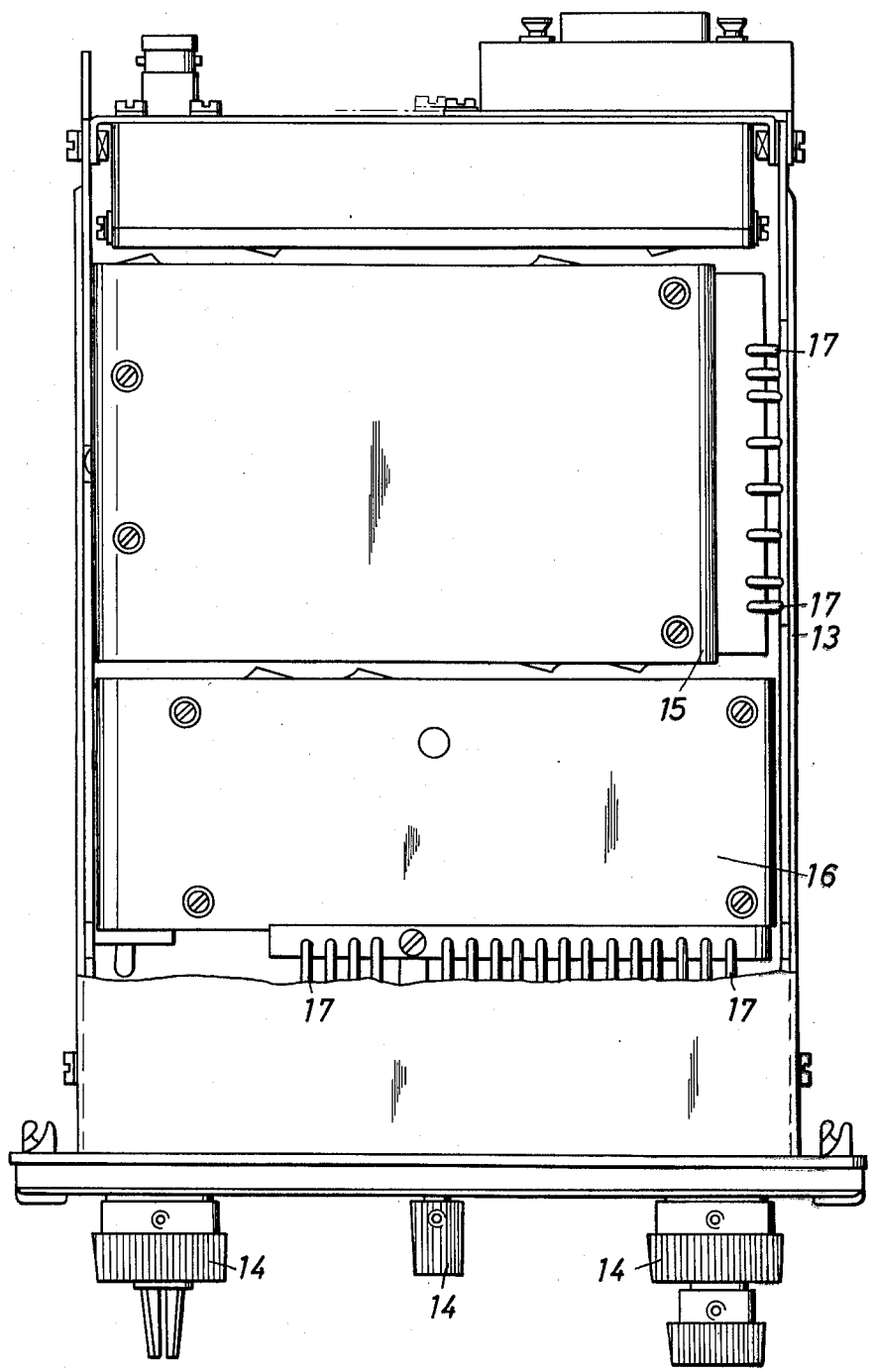
FIG. 4 shows another embodiment of a radio telephone set seen from beneath.
Figure 5:
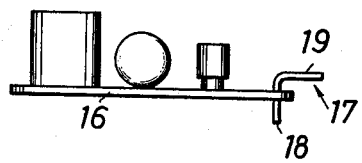
FIG. 5 is a side view of a plate bar.
Figure 6:
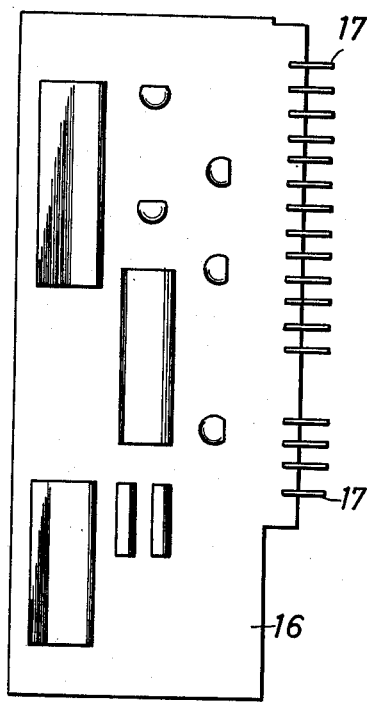
FIG. 6 is a plan view of the plate bar according to FIG. 5.

FIGS. 4-6 show another embodiment of the invention which also includes a printed circuit. FIG. 4 shows a transmitter set as viewed from below. A chassis 13 is shown with the front service knobs 14 and a receiver which is mounted on a printed circuit plate bar 15 and a portion 16 for the frequency generation on another plate bar. Receiver 15 and part 16 are provided with one row of conductive guide pins 17, which are bent in a right angle in a L-shaped position, as shown in FIG. 5, and extend through plate bar 15 or 16, respectively, in a vertical shank 18 so that the plate bar can be plugged into a multipolar socket which is mounted on the cable plate when the set is in an operating position. The other shank 19 runs parallel with respect to plate bar 16 or 15, respectively. After this shank is plugged into the socket of the plate bar, the plate bar extends vertically from the row of sockets when the plate bar is in testing position, so that it is freely accessible from all sides for testing. It is quite obvious from the foregoing that the row of guide pins may be differently structured, for example, may have a certain angular position without deviating from the concept of the novel invention.

What is claimed is:

1. A miniature compact mobile wireless radio telephone, aircraft and navigational communications set having a chassis defining an interior provided with closely-spaced channels for receiving a plurality of closely-spaced circuit plate bars with printed circuit elements and having a plurality of conductive guide pins disposed along one edge comprising:

a flat cable plate including printed circuit elements contained therein and having a plurality of rows of first socket means mounted in said channels and extending into said interior of said chassis, each row for receiving the conductive guide pins of one of said circuit plate bars so as to retain said circuit plate bars within the chassis of the communications set; and said flat cable plate having a plurality of rows of second socket means electrically connected respectively in pairs by means of said printed circuit elements to said plurality of rows of first socket means and mounted in said chassis and extending exteriorly of said plate to permit the conductive guide pins of said circuit plate bars to be selectively connected to a corresponding row of said second socket means so that the circuit elements would be freely accessible externally for testing, said plurality of rows of second socket means being directed opposite to said plurality of rows of first socket means so that said circuit plate bars can be removed from said first socket means and connected to said second socket means in an opposite direction, said plurality of rows of first and second socket means are spaced apart relative to the chassis to permit said circuit plate bars to be tested externally of the chassis.

2. The communications set as recited in claim 1, wherein at least one of said circuit plate bars has L-shaped conductive guide pins disposed along one edge, said L-shaped guide pins having one shank portion perpendicular to said one plate bar which extends through said one plate bar vertically relative thereto so that said one plate bar may be plugged into one of said socket means when the set is in an operating position and a second shank of said L-shaped guide pins which extend parallel to said one plate bar along its edge so that said one plate bar may be vertically plugged into said socket means when the set is in a test position.

* * * * *